United States Patent

[11] 3,562,606

[72] Inventors John Heer
West Newbury;
James A. Trinchera, Hamilton, Mass.
[21] Appl. No. 849,751
[22] Filed Aug. 13, 1969
[45] Patented Feb. 9, 1971
[73] Assignee Varian Associates
Palo Alto, Calif.
a corporation of California

[54] SUBSURFACE GALLIUM ARSENIDE SCHOTTKY-TYPE DIODE AND METHOD OF FABRICATING SAME
6 Claims, 3 Drawing Figs.

[52] U.S. Cl. .................... 317/234, 317/235; 29/578
[51] Int. Cl. .................... H01l 9/00, H01l 7/36
[50] Field of Search .................... 317/235/31, 234, 235, 235/47.1, 234/5.2

[56] References Cited
UNITED STATES PATENTS
3,271,636 9/1966 Irvin .................... 317/234
OTHER REFERENCES
Kano et al., Journal of Applied Physics, Vol. 37, No. 8, July 1966. pp. 2985— 2987 relied on.

*Primary Examiner*—John W. Huckert
*Assistant Examiner*—Martin H. Edlow
*Attorneys*—Stanley Z. Cole and Harry E. Aine

ABSTRACT: A Schottky-type diode is fabricated by depositing a metallic layer of an alloy of silver with zinc and indium on the surface of an n-type gallium arsenide wafer. The wafer is heat treated at 650° C. in a reducing atmosphere to form a subsurface junction displaying Schottky-type barrier characteristics and having improved stability.

FIG. 1
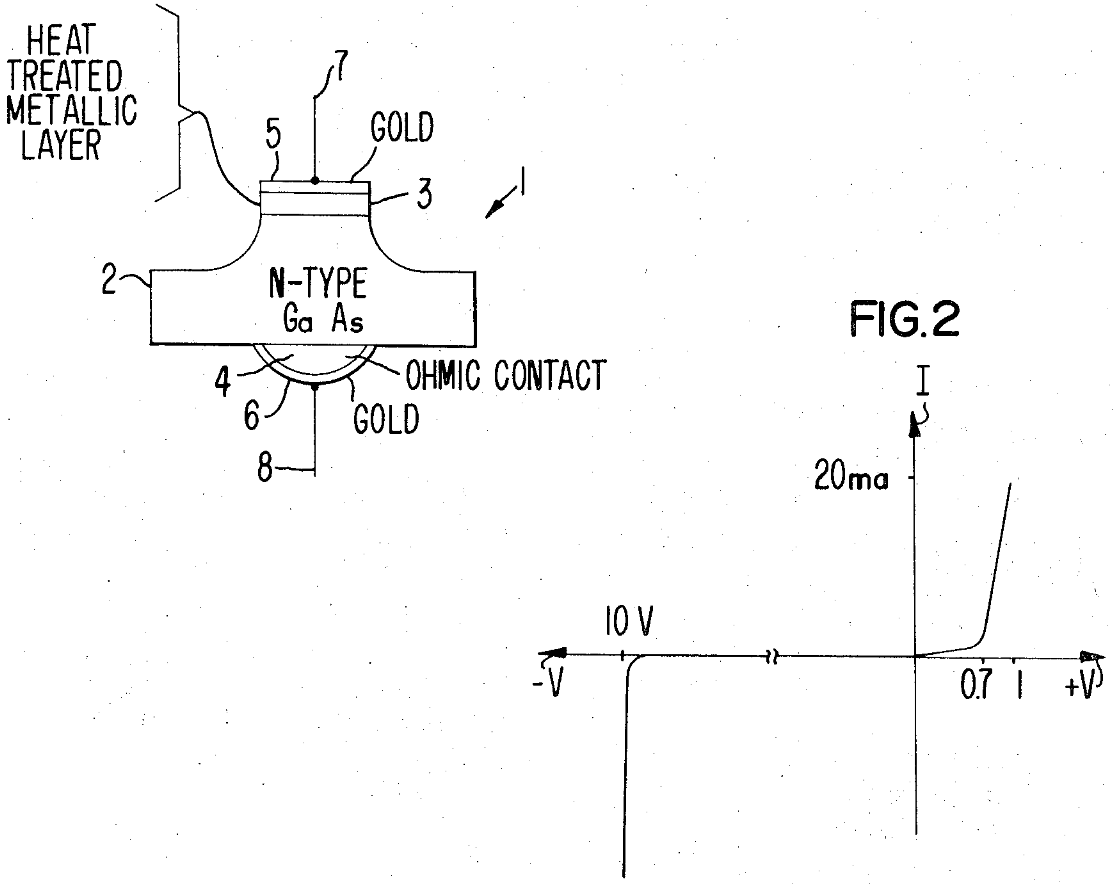
FIG. 1, FIG. 2
FIG. 3
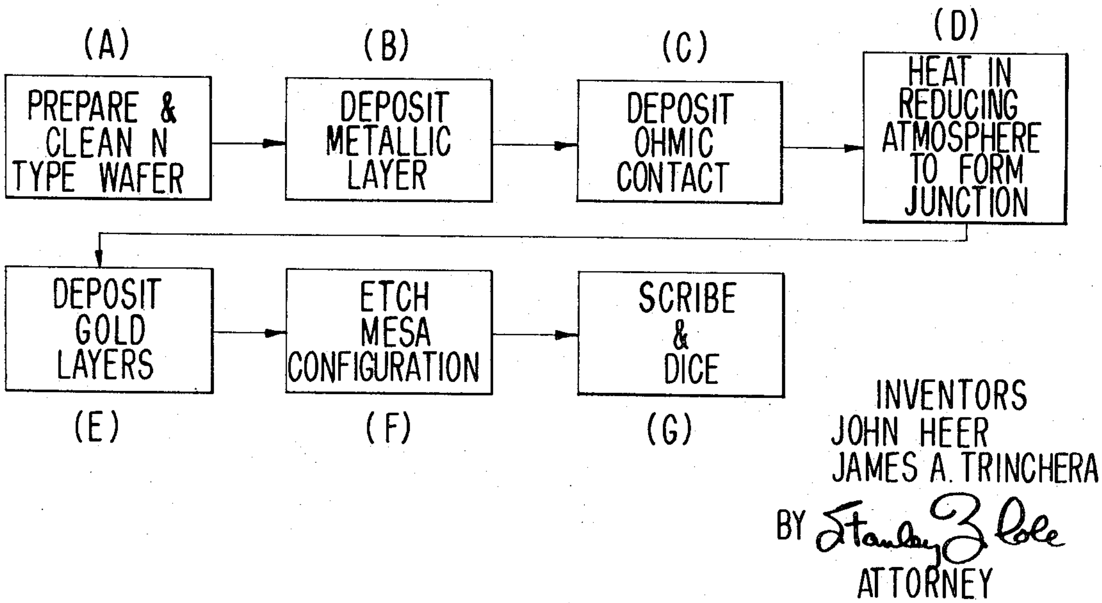
INVENTORS
JOHN HEER
JAMES A. TRINCHERA
BY Stanley Z. Cole
ATTORNEY

SUBSURFACE GALLIUM ARSENIDE SCHOTTKY-TYPE DIODE AND METHOD OF FABRICATING SAME

DESCRIPTION OF THE PRIOR ART

Heretofore, metallic layers of molybdenum, tungsten, gold or nickel have been deposited, at essentially room temperature, upon the surface of an *n* doped gallium arsenide wafer. The resultant device is a Schottky diode useful for fast switching and as a microwave detector. On of the problems with this prior art Schottky diode has been the existence of high density surface states at the metal GaAs interface which limits the stability and the operational life of the device. Therefore, a need exists for an improved Schottky diode having an improved junction exhibiting improved stability.

SUMMARY OF THE PRESENT INVENTION

The principal object of the present invention is the provision of an improved GaAs Schottky-type diode and methods of fabricating same.

One feature of the present invention is the provision of a Schottky-type barrier junction between a metallic layer, consisting of an alloy metal selected from the class of silver alloyed with zinc and indium, and *n* type GaAs, whereby the junction formed by heat treating produces a subsurface Schottky-type barrier junction having improved stability.

Another feature of the present invention is the same as any one or more of the preceding features wherein the metallic alloy layer comprises by weight approximately 95 percent silver, 3 percent zinc and 2 percent indium.

Another feature of the present invention is the same as any one or more of the preceding features wherein the metallic layer is heat treated upon the *n*-type semiconductive member to form the junction.

Another feature of the present invention is the same as the preceding feature wherein the heat treating is at 650° C. in a reducing atmosphere.

Other features and advantages of the present invention will become apparent upon a perusal of the following specification taken in connection with the accompanying drawings wherein:

BRIEF DESCRIPTION OF THE DRAWINGS

FIG. 1 is a schematic cross-sectional line diagram of a Schottky-type diode incorporating features of the present invention, FIG. 2 is a plot of current I versus voltage V depicting the current versus voltage characteristics of the diode of FIG. 1, and FIG. 3 is a flow diagram, in block diagram form, depicting the method for fabricating Schottky-type diodes according to the present invention.

DESCRIPTION OF THE PREFERRED EMBODIMENTS

Referring now to FIG. 1 there is shown a Schottky-type diode 1 incorporating features of the present invention. The diode 1 includes a main body member (substrate wafer) 2 of an *n*-type material consisting of gallium arsenide. In a typical example, the main body 2 is approximately 0.005 inches thick and comprises gallium arsenide doped with a donor-type dopant such as silicon or tin to provide a carrier concentration of approximately $10^{16}$ carriers per cubic centimeter, such material having a resistivity of 0.1 ohm centimeters.

A heat treated metallic layer 3 is formed on the substrate 2 to produce a Schottky-type barrier junction therebetween. The typical forward conductive characteristic for the resultant junction is as shown in FIG. 2. Extrapolation of the forward characteristic to zero current yields an estimated barrier height of approximately 0.7 volts, as indicated in FIG. 2. The heat treated metallic layer has a thickness of a few thousand Angstroms and comprises a composite of silver, zinc, indium, gallium and arsenic. In a typical example, the initially deposited alloy comprises by weight approximately 95 percent silver with 3 percent zinc and 2 percent indium. A gold-germanium ohmic contact 4 is formed on the *n*-type semiconductive wafer 2 on the side thereof opposite from layer 3. Gold layers 5 and 6, respectively, are formed over layer 3 and the ohmic contact 4 for affixing electrical leads 7 and 8 to the diode 1. The diode is of the mesa configuration, as obtained by chemical etching through the gold, layer 3, and into the *n*-type layer 2.

The precise nature of the junction between the layer 3 and the *n* wafer 2 is not known. It is possible that a compound could form at the junction between layer 3 and the *n* material 2, with the compound being metallic in nature. As an alternative theory, it is possible that a heterojunction could be formed between layer 3 and the *n* material, with the heterojunction comprising, for example, an alloy formation of indium arsenide with the gallium arsenide of the *n* material.

Referring now to FIG. 3 there is shown, in block diagram form, the method for fabricating the diode 1 of FIG. 1. In step A, the *n*-type wafer of gallium arsenide, is cleaned and placed into an evaporator, a device for depositing materials by evaporation, sublimation, sputtering, etc. The wafer may be cleaned in any one of a number of conventional ways, such as by chemical etching followed by ultrapure water rinses or by a high temperature gas etch with hydrogen and hydrochloric gas, or by RF sputter cleaning in an inert gas atmosphere.

In step B, a ternary metal composed of 95 percent silver, 2 percent indium and 3 percent zinc is thermally evaporated at $10^{-6}$ Torr onto one side of the wafer 2 to a thickness of a few thousand Angstroms.

In step C, a layer of gold and germanium is evaporated in the conventional manner onto the opposite side of the wafer 2 to form a conventional ohmic contact 4.

In step D, the wafer 2, with the deposited layers, is heat treated at 650° C. in a dry hydrogen atmosphere for 3 minutes to form a subsurface Schottky-type barrier junction between layer 3 and the *n*-type wafer 2.

In step E, the wafer is gold plated by conventional electrolytic plating techniques.

In step F, the mesa portion of the diode is formed by photoresist and chemical etching utilizing conventional techniques.

In step G, the individual diodes 1 are scribed about their periphery and the wafer 2 is diced to form the diode structure of FIG. 1.

As used herein, "Schottky-type diode" is defined to mean a metal-semiconductive device including an *n*-type wafer having a metallic layer formed thereon to form a "Schottky-type barrier junction" therebetween.

Since many changes could be made in the above construction and many apparently widely different embodiments of this invention could be made without departing from the scope thereof, it is intended that all matter contained in the above description or shown in the accompanying drawings shall be interpreted as illustrative and not in a limiting sense.

We claim:

1. In a Schottky-type diode, means forming a member of *n*-type gallium arsenide semiconductive material, means forming a metallic layer of material joined to said semiconductive member to define a Schottky-type barrier at the junction of said *n* material and said metallic layer, a pair of terminals for applying a potential across said junction barrier, the improvement wherein, said metallic layer comprises an alloy of silver alloyed with zinc and indium.

2. The apparatus of claim 1 wherein said alloy comprises less than 10 percent by weight of zinc and indium.

3. The apparatus of claim 1 wherein said metallic layer comprises by weight approximately 95 percent silver, 3 percent zinc, 2 percent indium.

4. In a method for fabricating a Schottky-type diode the steps of, depositing a ternary metal layer of silver, zinc and indium on the surface of a member of *n*-type semiconductive materials, heating the *n*-type member and the metallic type layer to approximately 650° C. in a dry hydrogen atmosphere form a barrier junction between the metallic layer and said *n*-type semiconductive member.

5. The method of claim 4 wherein the *n*-type member is gallium arsenide.

6. The method of claim 4 in which the metallic layer is silver, zinc and indium including less than 10 percent by weight of zinc and indium.